United States Patent [19]
Suga

[11] Patent Number: 4,831,564

[45] Date of Patent: May 16, 1989

[54] APPARATUS FOR ESTIMATING AND DISPLAYING REMAINDER OF LIFETIME OF XENON LAMPS

[75] Inventor: Shigeru Suga, Tokyo, Japan

[73] Assignee: Suga Test Instruments Co., Ltd., Tokyo, Japan

[21] Appl. No.: 111,797

[22] Filed: Oct. 22, 1987

[51] Int. Cl.[4] ........................ G06F 15/20; G01R 31/22

[52] U.S. Cl. ................................ 364/551.01; 324/414; 364/481; 364/571.01; 364/571.07

[58] Field of Search ........... 364/550, 551, 571, 551.01, 364/481, 571.01, 571.04, 571.07; 355/35; 250/205, 503.1; 324/405, 407, 410, 414

[56] References Cited

U.S. PATENT DOCUMENTS

| | | | |
|---|---|---|---|
| 3,996,494 | 12/1976 | Suga | 250/205 |
| 4,385,344 | 5/1983 | Gonser | 250/503.1 |
| 4,687,919 | 8/1987 | Nagano | 250/205 |
| 4,707,796 | 11/1987 | Calabro et al. | 364/550 |
| 4,760,250 | 7/1988 | Loeppert | 250/205 |
| 4,760,609 | 7/1988 | Tamagaki | 250/205 |

OTHER PUBLICATIONS

ASTM (G26-84), "Operating Light-Exposure Apparatus (Xenon-Arc Type) with and without Water for Exposure of Nonmetallic Materials"; pp. 1043-1053.

*Primary Examiner*—Parshotam S. Lall

*Assistant Examiner*—Kevin J. Teska

*Attorney, Agent, or Firm*—Wenderoth, Lind & Ponack

[57] ABSTRACT

An apparatus for estimating and displaying the remainder of the lifetime of xenon lamps has a memory in which is stored data on the values of the discharge power of an average xenon lamp for maintaining the irradiance of the light emitted from the xenon lamp on the surface of a sample at a predetermined level, and the corresponding time of use of the average xenon lamp; a discharge power measuring device for measuring the level of the discharge power of a xenon lamp being used to irradiate the surface of a sample while the xenon lamp is being controlled to maintain the irradiance of the light emitted from the xenon lamp on the surface of the sample at a predetermined level; a timer for providing at each of a plurality of predetermined times instructions for starting a comparison of the value of the discharge power of said xenon lamp being used with the stored values; an arithmetic unit for obtaining from the memory the value of the stored cumulative time of use corresponding to the measured value of the discharge power of said xenon lamp being used and the value of the limit time of use of the average xenon lamp, and computing the difference as the estimated remainder of the lifetime of the xenon lamp being used; and a display for indicating the estimated remainder of the lifetime of the xenon lamp.

1 Claim, 2 Drawing Sheets

APPARATUS FOR ESTIMATING AND DISPLAYING REMAINDER OF LIFETIME OF XENON LAMPS

FIELD OF THE INVENTION

This invention relates to an apparatus for estimating and displaying the remaining life of a xenon lamp for use, for example, as a light source in a light-fastness testing device.

BACKGROUND OF THE INVENTION

There are no apparatuses that are adapted to estimate the remainder of the lifetime of a xenon lamp used in a light-fastness tester as a light source, and then displaying the estimated remainder i.e. the time during which the xenon lamp can still be used, in terms of hours. The remainder of the lifetime of a xenon lamp has generally been estimated on the basis of empirical facts only. For example, the remainder of the lifetime of a xenon lamp which has a maximum usable life of 2000 hours, and which has already been used for 500 hours, is estimated to have a remaining lifetime of 1500 hours by subtracting 500 hours from 2000 hours.

In such a case, a cumulative time measuring instrument is used for conveniently memorizing the time which the xenon lamp in question has been used. When the xenon lamp in question starts being used, the pointer of the cumulative time measuring instrument is set to zero so that the time of use of the xenon lamp is cumulatively displayed thereon.

It is essential for a light-fastness tester to apply a constant irradiance of the light emitted from a light source at all times on the surface of a sample to be tested. Since the irradiance of the light applied from a xenon lamp to a sample decreases as the time of use thereof increases, it is necessary that the level of discharge power of the xenon lamp be varied so as to maintain a predetermined irradiance.

An automatic xenon lamp energy regulator provided with a light-receiving sensor in a sample position and adapted to automatically control the discharge power of a xenon lamp for the purpose of maintaining the irradiance of the light emitted therefrom at a constant level on the surface of a sample has heretofore been used.

Since the xenon lamps are used in combination with optical glass filters, the lifetimes of the lamps differ with the condition of deterioration of the optical glass filters and the variation in the performance of the lamps, so that it is difficult to estimate accurately the remainder of the lifetime of each lamp.

A test carried out by a light-fastness tester may be conducted for as long as 2000 hours or more in some cases where the quality of the object being tested is high. When a xenon lamp fails at a midnight or on a holiday during the operation of the light-fastness tester, the sample being subjected to a long test time is wasted in many cases and causes a great loss. Therefore, it is important to be able to estimate accurately the remainder of the lifetime of the xenon lamp to avoid interruptions in or permature ending of light-fastness tests.

OBJECT AND BRIEF SUMMARY OF THE INVENTION

The object of the present invention is to provide an apparatus for more accurately estimating the remainder of the lifetime of a xenon lamp. To that end, the present invention provides an apparatus for estimating and displaying the remainder of the lifetime of xenon lamps, comprising: a memory having stored therein data on the values of the discharge power of an average xenon lamp, which varies with the passage of time, for maintaining the irradiance of the light emitted from the xenon lamp on the surface of a sample at a predetermined level, and the corresponding time of use of the average xenon lamp; a discharge power measuring means for measuring the level of the discharge power of a xenon lamp being used to irradiate the surface of a sample while the xenon lamp is being controlled to maintain the irradiance of the light emitted from the xenon lamp on the surface of the sample at a predetermined level; a timer for providing at each of a plurality of predetermined times instructions for starting a comparison of the value of the discharge power of said xenon lamp being used with the stored values; an arithmetic unit to which said discharge power measuring means, said timer and said memory are connected for obtaining from said memory the value of the stored cumulative time of use corresponding to the measured value of the discharge power of said xenon lamp being used and the value of the limit time of use of the average xenon lamp, and computing the difference as the estimated remainder of the lifetime of the xenon lamp being used; and a display means connected to said arithmetic unit for receiving the said difference from said arithmetic unit indicating thereon the estimated remainder of the lifetime of said xenon lamp.

In order to operate a tester using the apparatus, a previously unused xenon lamp with which a previously unused optical glass filter is used is energized, and the irradiance of the light emitted from the xenon lamp on the surface of the sample being tested is controlled automatically to be at a constant level, the level of the discharge power of the lamp, which varies as the time of use of the lamp increases, is measured with the discharge power measuring instrument, a computation start signal from the timer is sent to the arithmetic unit at each of a predetermined plurality of times, a signal corresponding to the level of the discharge power measured by the discharge power measuring instrument is compared with the level of the signals stored in the memory, and the time of use of the lamp corresponding to the level of this signal is outputted.

In the meantime, the level of the discharge power representative of the limit of use of the xenon lamp is determined in advance, and the time of the limit of use of the xenon lamp corresponding to this level of the discharge power is outputted. The subtraction (time of limit of use of xenon lamp)—(cumulative time of use of xenon lamp corresponding to the level of signal)=-(remaining lifetime of xenon lamp) is carried out by the arithmetic unit, the result being indicated on a display for indicating the remaining lifetime of the xenon lamp.

The above and other objects as well as advantageous features of the invention will become apparent from the following description of a preferred embodiment taken in conjunction with the accompanying drawings.

DESCRIPTION OF THE PREFERRED EMBODIMENT

An embodiment of the present invention will now be described.

Figure 2:
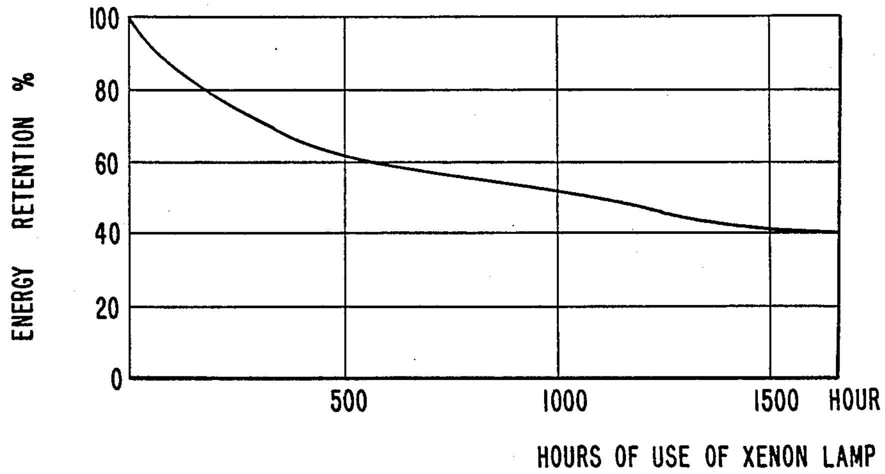
FIG. 2 is a graph illustrating the relation between the time of use of a xenon lamp and the energy-retention rate thereof.

The variations of the energy-retention rate of the ultraviolet rays (300–400 nm) among the rays of light emitted from the xenon lamp energized with the level of discharge power maintained at a constant level, which rate decreases as the time of use of a xenon lamp increases, are shown in FIG. 2. The initial energy-retention rate is expressed as 100%. The energy-retention rate decreases rapidly for the initial 100 hours of use, and thereafter decreases slowly to nearly 40% after 1500 hours of use.

Figure 3:
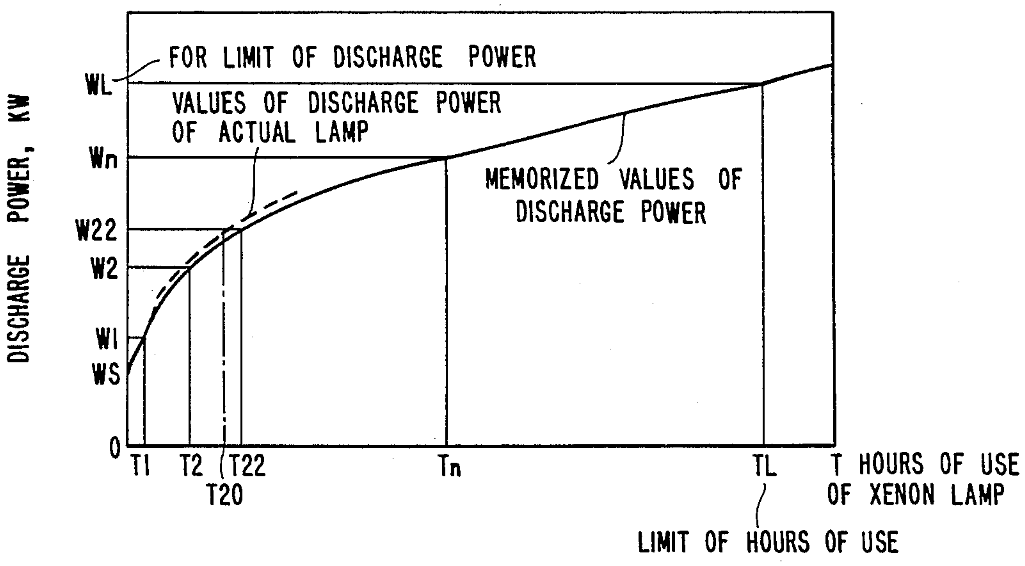
FIG. 3 is a graph illustrating the relation between the time of use of a xenon lamp and the level of the discharge power thereof.

This means that if the xenon lamp is used with its discharge power maintained at a constant level, the irradiance on the surface of a sample of the emitted from the xenon lamp, which is 100% at the time of the initial energizing thereof, becomes 40% after 1500 hours use. This does not meet the requirement that, when the light-fastness of a sample is tested, the irradiance of the light emitted from a light source on the surface of the sample be maintained at a constant level, which is an essential condition for practical use of a light-fastness tester. Therefore, the discharge power of a xenon lamp is regulated automatically by an automatic xenon lamp energy regulator so that the irradiance of the light emitted therefrom on the surface of a sample remains constant. As shown in FIG. 3, the curve representative of the relation between the time of use of a xenon lamp and the discharge power thereof rises rapidly in the initial period of time from the initial value WS through valves W1 and W2, and thereafter rises slowly, in contrast with the energy retention referred to previously. A discharge power value WL which is representative of the discharge power value at the limit of the useful life of the xenon lamp is determined. The limit time of use TL corresponding to this limit discharge power value is then determined.

| | Time of use | Value of discharge power |
|---|---|---|
| Starting of lighting | 0 hour | Ws |
| After starting of lighting | T1 hour | W1 |
| | T2 hour | W2 |
| | Tn hour | Wn |
| Time representative of limit of use | TL hour | Electric power representative of limit of use WL |

The data (in practice the average values obtained for a plurality of embodiments) on the time of use (0, T1 . . . Tn . . . TL) and values of discharge power (Ws, W1 . . . Wn . . . WL) are determined in advance.

First, a previously unused xenon lamp and an optical glass filter are set in a light fastness tester, and variations in the time of use versus the increased level of discharge power of the xenon lamp are measured while the irradiance of the light emitted from the xenon lamp on the surface of a sample is controlled automatically so that it remains at a constant level.

A plurality of previously unused xenon lamps are subjected to this measurement under the same conditions, and an average level of discharge power at each hour during the life of the xenon lamp is determined in advance, and the relation between the times of use (0, T1 . . . Tn . . . TL) of the xenon lamp and the levels of the discharge power (Ws, W1 . . . Wn . . . WL) thereof are stored in the memory of the apparatus.

Figure 1:
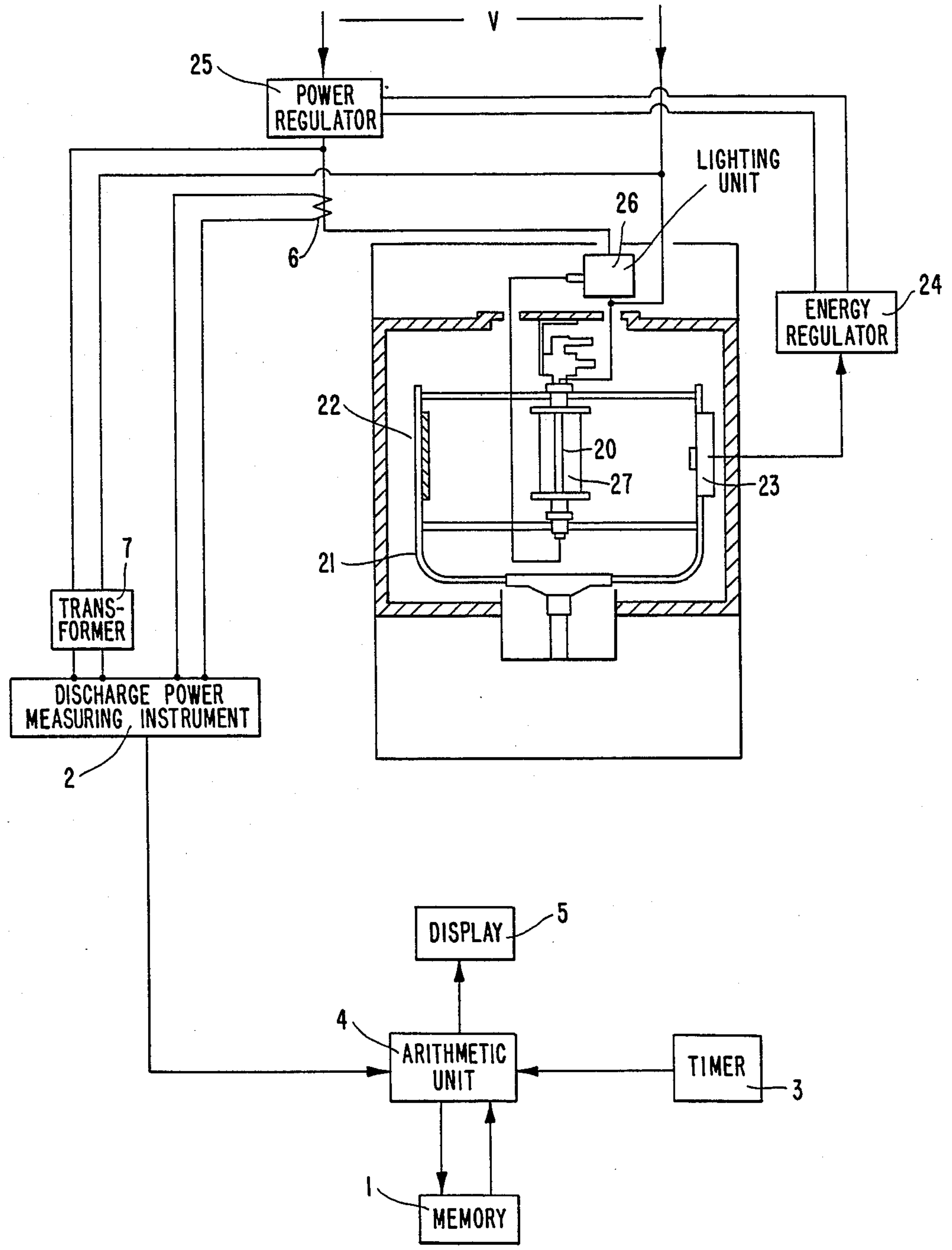
FIG. 1 illustrates the construction of a light-fastness tester using an apparatus according to the present invention.

The construction of a tester incorporating the apparatus of the present invention is shown diagrammatically in FIG. 1.

A frame 21 for a sample to be tested is provided, which is adapted to be rotated around a xenon lamp 20, and a sample 22 to be tested and a light-receiving element 23 are attached to the frame 21. The xenon lamp is energized by a lighting unit 26, and the light-receiving element receives ultraviolet rays from the xenon lamp, and a signal representative of the level of infrared rays is sent to an automatic xenon lamp energy regulator 24. An electric power regulator 25 is operated by regulator 24 to control the level of the discharge power of the xenon lamp so that the irradiance from the lamp remains constant. The xenon lamp is surrounded by an optical glass filter 27 and is cooled with water. The construction described thus far corresponds to the prior art tester.

The apparatus according to the invention comprises a current transformer 6 and a transformer 7 provided in the xenon lamp lighting circuit, and a discharge power measuring instrument 2 connected to the transformers and which is adapted to calculate the actual value of the discharge power of the lamp on the basis of the effective values of the discharge amperage and discharge voltage being supplied to the lamp. An arithmetic unit 4 is provided and a signal representative of the value of the discharge power from the discharge power measuring instrument is supplied to the arithmetic unit 4 in accordance with a computation start signal outputted at certain time intervals from a timer 3 connected to the arithmetic unit. A memory 1 in which values representative of the relation between the time of use of an average lamp (T1 . . . Tn . . . TL) and values of the discharge power (Ws, W1 . . . Wn . . . WL), which are determined in advance as described above, are stored, is also provided. The discharge power signal is compared with the values stored in the memory, and an approximate time of use corresponding to this value of discharge power is determined. This time of use is subtracted from the limit time of use (TL) previously set in the arithmetic unit, and the balance is indicated on a display 5 as the estimated remainder of the lifetime of the xenon lamp 20. For example, if an actual value of discharge power is W22 when the actual time of use is 20 hours, the value of discharge power W22 is sent to the arithmetic unit, the corresponding time of use is searched among the values (T1 . . . Tn . . . TL) stored in the memory for value 22W, and value T22 is found.

The arithmetic unit then determines the estimated remaining life t from the value T22 and the limit time of use TL, by the calculation $t=TL-T22$, and t is indicated on the display as the estimated remaining life of the xenon lamp.

Thus, by use of the present invention, the remainder of the lifetime of the xenon lamp can be estimated. Accordingly, if the end of the lifetime is expected to occur in the nighttime or on a holiday, the xenon lamp can be replaced in advance, so that the burnout, which causes a test failure and a great loss, of the xenon lamp will not occur at all. If the remainder of the lifetime of the xenon lamp is found to be abnormally short, this may indicate not only an abnormal condition of the xenon lamp but also of the filter, cooling water or lighting unit. The present invention thus has a great effect in the normal and safe operation of a light fastness tester using xenon lamps.

The present invention is not, of course, limited to the above embodiment; it may be modified in various ways within the scope of the appended claims.

What is claimed is:

1. An apparatus for estimating and displaying the remainder of the lifetime of xenon lamps, comprising:

a memory having stored therein data on values of the discharge power of an average xenon lamp, which values vary with passage of time, for maintaining irradiance of the light emitted from the xenon lamp in a surface of a sample at a predetermined level, and the corresponding time of use of the average xenon lamp;

a discharge power measuring means for measuring a level of the discharge power of a xenon lamp being used to irradiate the surface of a sample while the xenon lamp is being controlled to maintain the irradiance of the light emitted from the xenon lamp on the surface of the sample at a predetermined level;

a timer for providing at each of a plurality of predetermined times instructions for starting a comparison of the value of the discharge power of said xenon lamp being used with the stored values;

an arithmetic unit to which said discharge power measuring means, said timer and said memory are connected for obtaining from said memory the value of a stored cumulative time of use corresponding to the measured value of the level of the discharge power of said xenon lamp being used and the value of the limit time of use of the average xenon lamp, and computing the difference as the estimated remainder of the lifetime of the xenon lamp being used; and a display means connected to said arithmetic unit for receiving the said difference from said arithmetic unit indicating thereon the estimated remainder of the lifetime of said xenon lamp.

* * * * *